(12) United States Patent
Sagawa et al.

(10) Patent No.: US 10,002,801 B2
(45) Date of Patent: Jun. 19, 2018

(54) DEVICE MANUFACTURING METHOD AND DEVICE MANUFACTURING APPARATUS

(71) Applicant: HITACHI, LTD., Chiyoda-ku, Tokyo (JP)

(72) Inventors: Misuzu Sagawa, Tokyo (JP); Tetsufumi Kawamura, Tokyo (JP)

(73) Assignee: HITACHI, LTD., Tokyo (JP)

( * ) Notice: Subject to any disclaimer, the term of this patent is extended or adjusted under 35 U.S.C. 154(b) by 0 days. days.

(21) Appl. No.: 15/597,285

(22) Filed: May 17, 2017

(65) Prior Publication Data
US 2018/0005906 A1 Jan. 4, 2018

(30) Foreign Application Priority Data

Jun. 29, 2016 (JP) ................................. 2016-128550

(51) Int. Cl.
| | |
|---|---|
| *H01L 21/00* | (2006.01) |
| *B81C 1/00* | (2006.01) |
| *H01L 21/66* | (2006.01) |
| *H01L 21/306* | (2006.01) |
| *H01L 21/67* | (2006.01) |
| *B81C 99/00* | (2010.01) |

(52) U.S. Cl.
CPC .......... *H01L 22/20* (2013.01); *B81C 1/00547* (2013.01); *B81C 99/0025* (2013.01); *B81C 99/0065* (2013.01); *H01L 21/30604* (2013.01); *H01L 21/67069* (2013.01); *H01L 21/67253* (2013.01); *H01L 21/67259* (2013.01); *B81C 2201/0142* (2013.01)

(58) Field of Classification Search
CPC ......... H01L 21/30604; H01L 21/67069; H01L 21/67253; H01L 21/67259; H01L 21/3065; H01L 21/30612; H01L 21/0237; H01L 21/0259; H01L 22/20; H01L 22/12; B81C 1/00547; B81C 1/0015; B81C 1/00484; B81C 1/00206; B81C 2201/0142; B81C 2201/0132; B81C 2201/00404
See application file for complete search history.

(56) References Cited

U.S. PATENT DOCUMENTS

| | | | |
|---|---|---|---|
| 6,559,459 B2 * | 5/2003 | Tanaka ..................... | H01J 37/21 250/397 |
| 7,267,731 B2 | 9/2007 | Iwasaki | |
| 7,709,792 B2 * | 5/2010 | Naser-Ghodsi ......... | H01J 37/28 250/307 |

(Continued)

FOREIGN PATENT DOCUMENTS

JP 2004-209626 A 7/2004

*Primary Examiner* — Nikolay Yushin
(74) *Attorney, Agent, or Firm* — Miles & Stockbridge, P.C.

(57) ABSTRACT

The device manufacturing method includes a length measuring step (S5) of, on the basis of an observation target image of an SEM image taken from a direction having a predetermined angle from a direction perpendicular to a plane of a substrate, measuring the thickness of a target object, or the depth of etching, formed on the substrate. In addition, in the length measuring step, an etching angle made by a cross section of the etching and the direction perpendicular to the plane of the substrate is calculated from processing data of the target object, and the thickness of the target object or the depth of the etching is measured on the basis of the calculated etching angle.

12 Claims, 9 Drawing Sheets

(56) References Cited

U.S. PATENT DOCUMENTS

| | | | |
|---|---|---|---|
| 2002/0053643 A1* | 5/2002 | Tanaka | H01J 37/21 250/491.1 |
| 2004/0007063 A1* | 1/2004 | Tai | B81B 3/0078 73/488 |
| 2007/0158562 A1* | 7/2007 | Nasser-Ghodsi | H01J 37/28 250/310 |

* cited by examiner

| CONDITIONS | MATERIAL | CURRENT | VOLTAGE | ... | DEVIATION ANGLE (φ) |
|---|---|---|---|---|---|
| 1 | W | 80pA | 30kV | | 3deg |
| 2 | W | 100pA | 30kV | | 5deg |
| ... | | | | | |
| n | | | | | |

DEVICE MANUFACTURING METHOD AND DEVICE MANUFACTURING APPARATUS

BACKGROUND OF THE INVENTION

1. Field of the Invention

The present invention relates to a device manufacturing method and a device manufacturing apparatus, and relates to, for example, a device manufacturing method, and a device manufacturing apparatus, for manufacturing MEMS (Micro Electro Mechanical Systems).

2. Description of the Related Art

JP 2004-209626 A discloses a technique in which a shape of a prototype structure manufactured by FIB (Focused Ion Beam) is compared with a design shape, and real processing is performed while processing conditions are corrected so as to adjust the difference therebetween.

SUMMARY OF THE INVENTION

The technique disclosed in the above-described JP 2004-209626 A has a problem that when the shape of the manufactured prototype structure is observed to compare the shape of the prototype structure manufactured by FIB with the design shape, an SEM (Scanning Electron Microscope) image obtained by using an electron beam is not suitable for length measurement because the SEM image is based on the observation from an oblique direction.

An object of the present invention is to provide a technique for enabling correct length measurement when an SEM image obtained by using an electron beam is observed from an oblique direction.

The above-described and other objects of the present invention and the novel features thereof will be made apparent from the statement of the present description and accompanying drawings.

The following is a brief description of the gist of the representative elements of the invention laid open in the present application.

A device manufacturing method according to one embodiment includes a length measuring step of, on the basis of an observation target image of an SEM image taken from a direction having a predetermined angle from a direction perpendicular to a plane of a substrate, measuring the thickness of a target object, or the depth of etching, formed on the substrate. In addition, in the length measuring step, an etching angle made by a cross section of the etching and the direction perpendicular to the plane of the substrate is calculated from processing data of the target object, and the thickness of the target object or the depth of the etching is measured on the basis of the calculated etching angle.

A device manufacturing apparatus according to one embodiment includes: an FIB-SEM unit that is a combined unit of an FIB unit and an SEM unit; and a control unit that controls the processing and observation in the FIB-SEM unit. The control unit includes a length-measuring processing part for, on the basis of an observation target image of an SEM image taken from a direction having a predetermined angle from a direction perpendicular to a plane of a substrate, measuring the thickness of a target object, or the depth of etching, formed on the substrate. In addition, the length-measuring processing part calculates, from processing data of the target object, an etching angle made by a cross section of the etching and the direction perpendicular to the plane of the substrate, and measures the thickness of the target object or the depth of the etching on the basis of the calculated etching angle.

The following is a brief description of the effects obtained by the representative elements of the invention laid open in the present application.

According to one embodiment, when an SEM image obtained by using an electron beam is observed from an oblique direction, correct length measurement can be performed.

BRIEF DESCRIPTION OF THE DRAWINGS

FIG. 7 is an explanatory chart illustrating an example of a database of the relationship between etching conditions and the deviation angle shown in FIG. 3;

DESCRIPTION OF THE PREFERRED EMBODIMENTS

Figure 1:
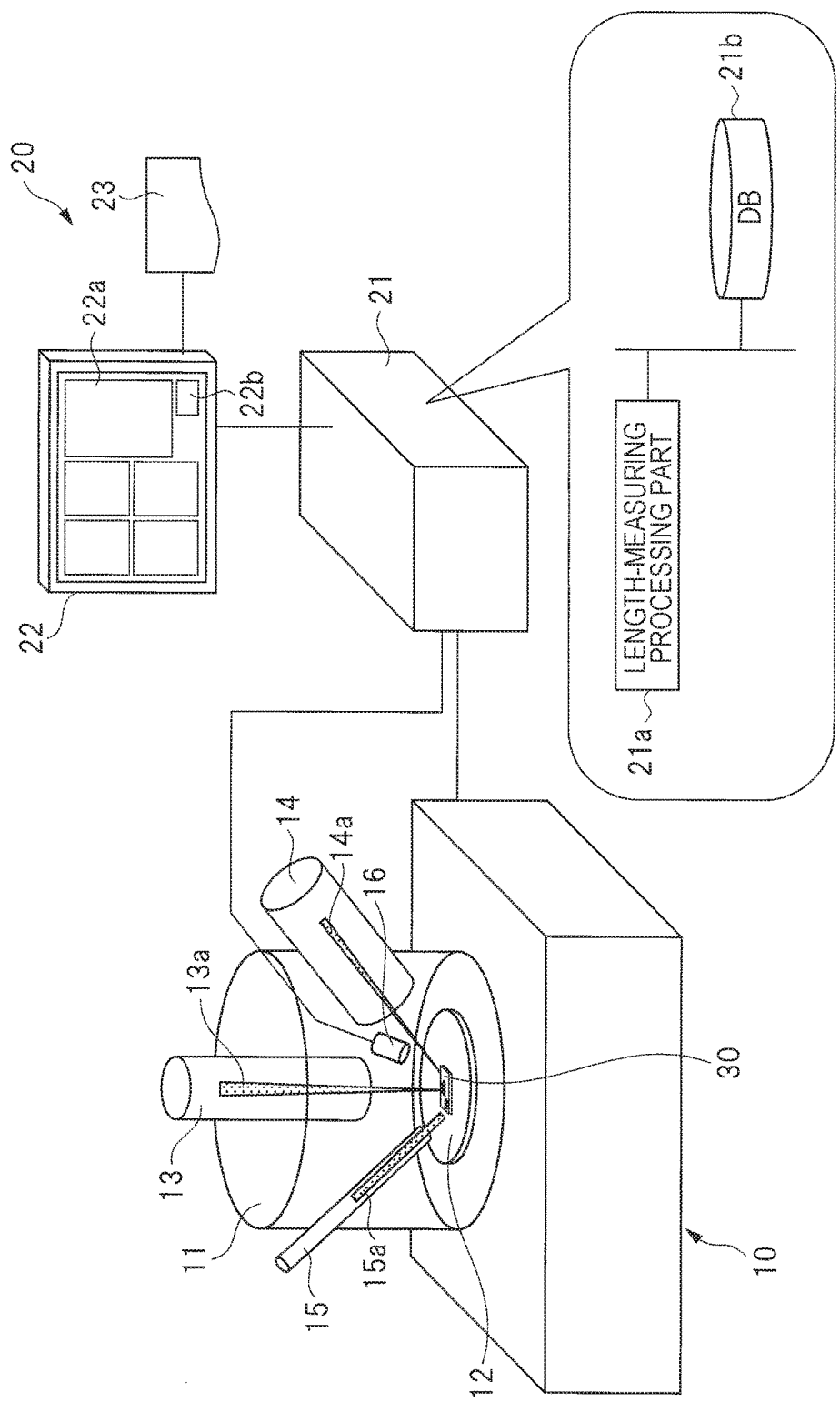
FIG. 1 is a configuration diagram illustrating an example of a configuration of a device manufacturing apparatus according to an embodiment.

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof.

Also, in the embodiments described below, when referring to the number of elements (including number of pieces, values, amount, range, and the like), the number of the elements is not limited to a specific number unless otherwise stated or except the case where the number is apparently limited to a specific number in principle. The number larger or smaller than the specified number is also applicable.

Further, in the embodiments described below, it goes without saying that the components (including element steps) are not always indispensable unless otherwise stated or except the case where the components are apparently indispensable in principle.

Similarly, in the embodiments described below, when referring to shapes, positional relationship or the like of the components, unless otherwise stated or except the case where the shape is apparently inapplicable in principle, substantially approximate or similar shapes are included. This applies to the values and range described above.

In addition, in all the drawings for describing the embodiments, members having the same functions are denoted by the same or related symbols and their repeated explanation is omitted. It should be noted that hatching may be used even in a plan view, and hatching may be omitted even in a cross-sectional view, so as to make the drawings easy to see.

Embodiments will be described in detail as below with reference to drawings. In order to make the features of the embodiments easier to understand, first of all, room for improvement existing in the related art will be described.

Room for Improvement

In order to manufacture a minute three-dimensional structure, a trial to apply a direct modeling technique that uses an FIB, a laser or the like is made. Above all, by applying direct modeling that uses an FIB, processes such as film formation, processing and inspection can be performed in succession in the same apparatus. In addition, since a photolithographic process is not required, the need for preparing a photo mask is eliminated. It is considered that utilizing these advantages enables to shorten a prototype manufacturing period of a MEMS device to a large extent. Accordingly, the inventors decide to utilize a direct modeling technique, which uses an FIB, for the prototype manufacturing and manufacturing of MEMS devices.

In general, when a device such as MEMS is manufactured, it is important to observe the size and shape of a structure, and to inspect the device to check whether or not the device has been manufactured according to a design made in advance. This is because if a modeling shape differs from a designed structure, desired MEMS characteristics cannot be obtained. The same applies to the direct modeling that uses the FIB without exception. The above-described JP 2004-209626 A discloses the technique in which a shape of a prototype structure manufactured by FIB is compared with a design shape, and real processing is performed while processing conditions are corrected so as to adjust the difference therebetween.

The technique disclosed in the JP 2004-209626 A has the problem that when the shape of the manufactured prototype structure is observed to compare the shape of the prototype structure manufactured by FIB with the design shape, an SEM image obtained by using an electron beam is not suitable for length measurement because the SEM image is based on the observation from an oblique direction.

Accordingly, the embodiments make devices for the room for improvement existing in the related art described above. A technical concept in the embodiments in which the devices have been made will be described as below with reference to drawings. The technical concept in the embodiments relates to providing a technique for enabling correct length measurement when an SEM image obtained by using an electron beam is observed from an oblique direction.

Embodiments

A device manufacturing method and a device manufacturing apparatus according to the embodiments will be described with reference to FIGS. 1 to 8. With respect to the device manufacturing method and the device manufacturing apparatus according to the embodiments, a device of a MEMS structure will be explained as an example of a device. However, other devices are also applicable.

Device Manufacturing Apparatus

A device manufacturing apparatus according to an embodiment will be described with reference to FIG. 1. FIG. 1 is a configuration diagram illustrating an example of a configuration of the device manufacturing apparatus according to the embodiment.

As shown in FIG. 1, the device manufacturing apparatus according to the present embodiment includes: an FIB-SEM unit 10 that is a combined unit of an FIB unit and an SEM unit; and a control unit 20. The FIB-SEM unit 10 is controlled by the control unit 20.

The FIB-SEM unit 10 includes a vacuum chamber 11, a stage 12, an ion gun 13, an electron gun 14, a gas gun 15 and a charged particle detector 16. The vacuum chamber 11 is a chamber that is used to perform processing such as etching and film formation for a device manufactured on a substrate 30, and that is used to observe the device after the processing. The stage 12 is disposed inside the vacuum chamber 11, and is a stage on which the substrate 30 is placed, the device being manufactured on the substrate 30.

The ion gun 13 is disposed inside the vacuum chamber 11. The ion gun 13 is used for etching and film formation that use an ion beam 13a, and is used to obtain an SIM (Scanning Ion Microscope) image. The electron gun 14 is disposed inside the vacuum chamber 11, and is used to obtain an SEM image by using an electron beam 14a. The gas gun 15 is disposed inside the vacuum chamber 11, and is used for etching and film formation that use a gas 15a. The charged particle detector 16 is used to obtain an SIM image or an SEM image.

For example, the control unit 20 controls driving of the stage 12, controls the ion gun 13 to emit the ion beam 13a therefrom, controls the electron gun 14 to emit the electron beam 14a therefrom, controls the gas gun 15 to blow the gas 15a therefrom, the stage 12, the ion gun 13, the electron gun 14 and the gas gun 15 being components of the FIB-SEM unit 10. The control unit 20 controls the processing and observation in the FIB-SEM unit 10.

In addition, the control unit 20 includes, as functions of a computer system, a calculation processing unit 21, a display and input unit 22, and an output unit 23. The calculation processing unit 21 includes a length-measuring processing part 21a, and a database (DB) 21b. The control unit 20 is also a system that instructs the FIB-SEM unit 10 to process and observe a device.

At the time of, for example, observation, the control unit 20 controls the calculation processing unit 21 to perform, for example, processing of measuring the thickness of a target object, or the depth of etching, formed on the substrate 30 on the basis of an observation target image of an SEM image taken from a direction (an observation direction 40 of the SEM shown in FIGS. 4A to 4C described below) having a predetermined angle from a direction perpendicular to a plane of the substrate 30.

In the calculation processing unit 21, for example, the length-measuring processing part 21a calculates, from processing data of the target object, an etching angle (a deviation angle $\varphi$ shown in, for example, FIG. 8 described below) made by a cross section of the etching and the direction perpendicular to the plane of the substrate, and performs, for example, processing of measuring the thickness of the target object or the depth of the etching on the basis of the calculated etching angle.

The database 21b is a storage unit that stores, as electronic information, design data of a device manufactured on the substrate 30, and a processing recipe, processing data and the like that are used to perform processing on the basis of the design data. The database 21b stores conditions of an ion beam for etching, and an etching angle made by the cross section of the etching and the direction perpendicular to the plane of the substrate with the conditions associated with the etching angle.

The processing recipe contains, as information used when a target object is formed on the substrate 30, information about the adjustment of the rotation of the stage 12 on which the substrate 30 is placed. In addition, as information used when a target object is formed on the substrate 30, the processing recipe also contains information about the order of the light and dark as the contrast used when the cross section of the etching is observed.

The display and input unit 22 includes a display function, and an input function based on a touch method. The display and input unit 22 includes a display and input interface 22a, and a start button 22b. The display and input interface 22a displays an SIM image and an SEM image, allows an operator to check the SIM image and the SEM image, displays a processing region, allows the operator to input the processing region, displays processing conditions, allows the operator to input the processing conditions, and performs other processing. After the operator inputs required information, the operator operates the start button 22b (by one click, one touch, or one tap) to instruct the start of processing.

The output unit 23 outputs, for example, the results of processing and observation. The output unit 23 outputs the SIM image, the SEM image, the processing region, the processing conditions and the like.

In the device manufacturing apparatus according to the present embodiment, after the operator inputs required information, when the operator operates the start button 22b to start processing, manufacturing of a device of a MEMS structure is automatically executed. For example, the device manufacturing apparatus automatically executes a length measuring step of measuring the thickness of a target object, or the depth of etching, formed on the substrate 30 on the basis of an observation target image of an SEM image taken from a direction having a predetermined angle from a direction perpendicular to the plane of the substrate 30. In the length measuring step, an etching angle made by a cross section of the etching and the direction perpendicular to the plane of the substrate is calculated from processing data of the target object, and the thickness of the target object or the depth of the etching is measured on the basis of the calculated etching angle. The length measuring step executed by the device manufacturing apparatus will be described in detail as below in conjunction with a device manufacturing method.

Device Manufacturing Method

Figure 2:
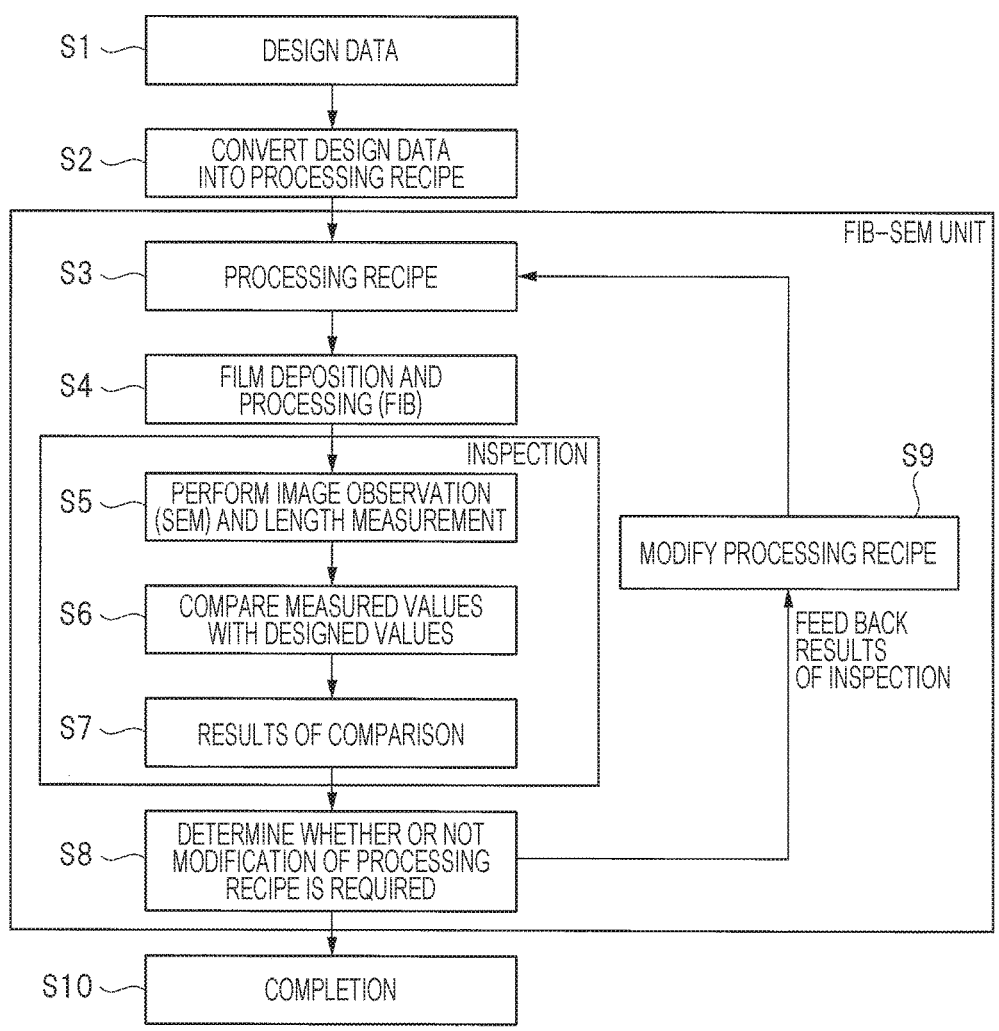
FIG. 2 is a flowchart illustrating an example of steps of a device manufacturing method according to the embodiment.

A device manufacturing method according to an embodiment will be described with reference to FIG. 2. FIG. 2 is a flowchart illustrating an example of steps of the device manufacturing method according to the embodiment.

The device manufacturing method according to the present embodiment is executed in the above-described device manufacturing apparatus, and is configured to automatically perform, on the basis of a processing recipe into which design data has been converted, manufacturing of a device, which is a target object, on the substrate 30 until the completion of the device by a manufacturing process including an inspection process, and when required, including a modification process based on feedback of the results of the inspection.

In the device manufacturing method according to the present embodiment, first of all, design data is input through the display and input unit 22 of the control unit 20 as shown in FIG. 2 (step S1). The design data is stored in the database 21b of the calculation processing unit 21. The calculation processing unit 21 of the control unit 20 then converts the design data to generate a processing recipe (step S2). The processing recipe is stored in the database 21b of the calculation processing unit 21.

The processing recipe contains information about the adjustment of the rotation of the stage 12 on which the substrate 30 is placed (a mark 35 on the substrate 30 shown in, for example, FIGS. 4A to 4C described below), and information about the order of the light and dark as the contrast used when a cross section of etching is observed (information about the contrast shown in FIG. 6C described below).

Next, a device is manufactured by the FIB-SEM unit 10 on the basis of the processing recipe (step S3). When the device is manufactured, for example, film deposition and processing are repeated, the ion beam 13a is emitted to perform etching and film formation, and the gas 15a is blown to perform etching and film formation (step S4).

After the device is manufactured in step S4, the FIB-SEM unit 10 performs image observation (SEM) and length measurement (step S5). When the image observation (SEM) and length measurement are performed, the manufactured device is irradiated with the electron beam 14a, and the length-measuring processing part 21a of the calculation processing unit 21 performs calculation processing by use of an SEM image detected by the charged particle detector 16 to obtain measured values. The details of step S5 will be described below with reference to FIG. 3.

Subsequently, the length-measuring processing part 21a of the calculation processing unit 21 compares the measured values with the designed values, and determines, on the basis of the results of comparison, whether or not a modification of the processing recipe is required (steps S6, S7, S8). As the result of the determination made on the basis of the results of comparison, for example, when the measured values fall within the designed values, it is determined that a modification of the processing recipe is not required, and therefore the manufacturing of the device is completed (step S10).

As the result of the determination made on the basis of the results of comparison, when the measured values do not fall within the designed values, it is determined that a modification of the processing recipe is required, and therefore the results of inspection are fed back to modify the processing recipe (step S9). Subsequently, processing from step S3 is repeated on the basis of the modified processing recipe. After that, when the measured values fall within the designed values, with the result that it is determined that a modification of the processing recipe is not required, the manufacturing of the device is completed (step S10).

As described above, in the device manufacturing method according to the present embodiment, the device as the target object can be manufactured on the substrate 30 by performing the manufacturing process, the inspection process, and when required, the modification process based on the feedback of the results of inspection, on the basis of the processing recipe into which the design data has been converted.

Figure 9:
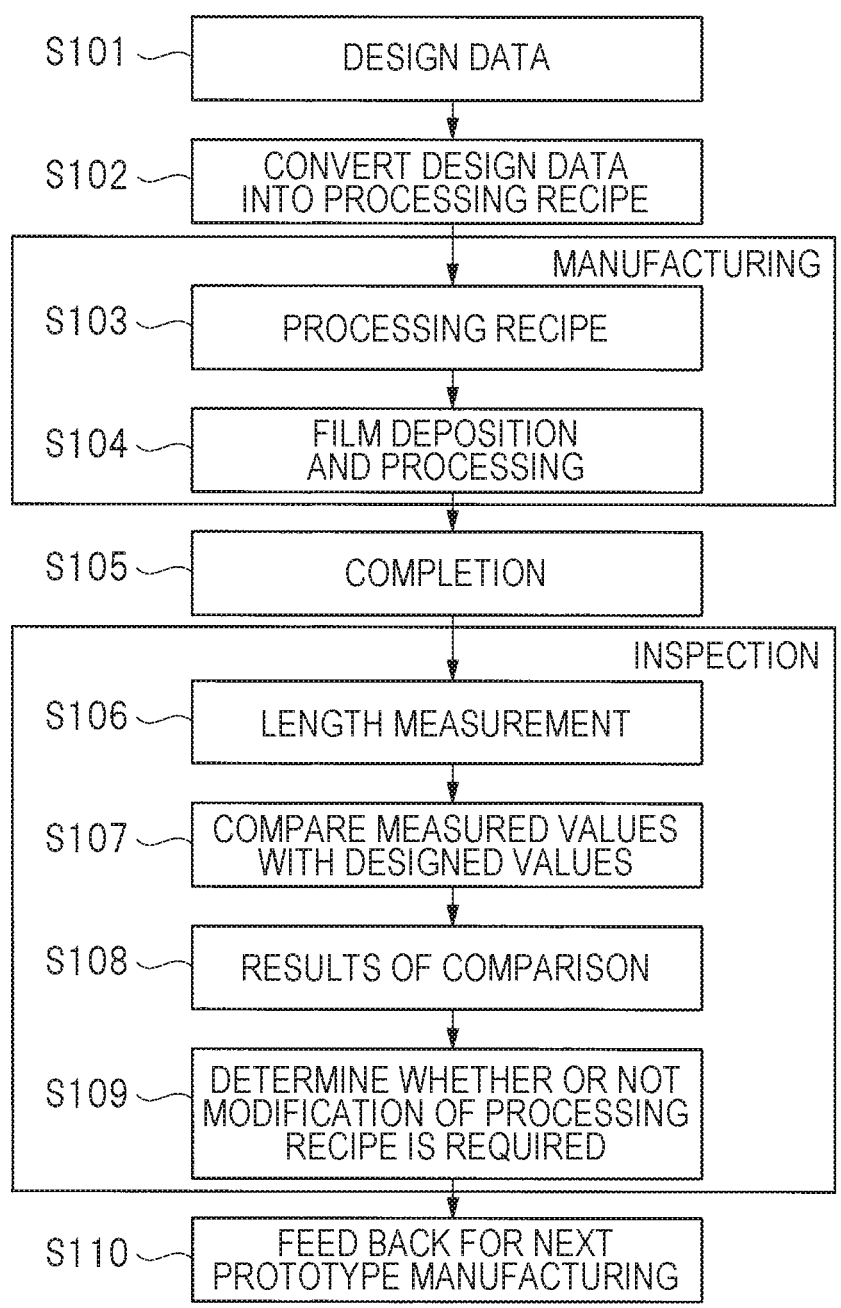
FIG. 9 is a flowchart illustrating an example of steps of a device manufacturing method as a comparative example for the embodiment.

Meanwhile, a device manufacturing method as a comparative example for the present embodiment includes steps as shown in FIG. 9. FIG. 9 is a flowchart illustrating an example of steps of the device manufacturing method as a comparative example for the embodiment.

In the device manufacturing method as the comparative example for the present embodiment, as shown in FIG. 9, a manufacturing process of repeating film deposition and processing is performed on the basis of a processing recipe into which design data has been converted (steps S101 to S105). Next, an inspection process is performed by subjecting the device, the manufacturing of which has been completed in the manufacturing process, to the length measurement, by comparing measured values with designed values to obtain the results of comparison, and by determining whether or not a modification of the processing recipe is required (steps S106 to S109). Subsequently, the results of inspection are fed back for the next prototype manufacturing (step S110).

Accordingly, in the device manufacturing method as the comparative example for the present embodiment, the inspection process is performed after all steps of the manufacturing process end, and the results of inspection are then fed back for the next prototype manufacturing. Therefore, there arises a problem that the number of times prototype manufacturing is performed increases, which causes the time required for the prototype manufacturing to increase. Meanwhile, in the device manufacturing method according to the present embodiment, the inspection process using the SEM is performed in the middle of the manufacturing process based on the FIB processing, and the results of inspection are then directly fed back to the subsequent modification process as described above. Therefore, modifying the processing recipe at the time of prototype manufacturing enables to reduce the time required for the prototype manufacturing.

Inspection Process

Figure 3:
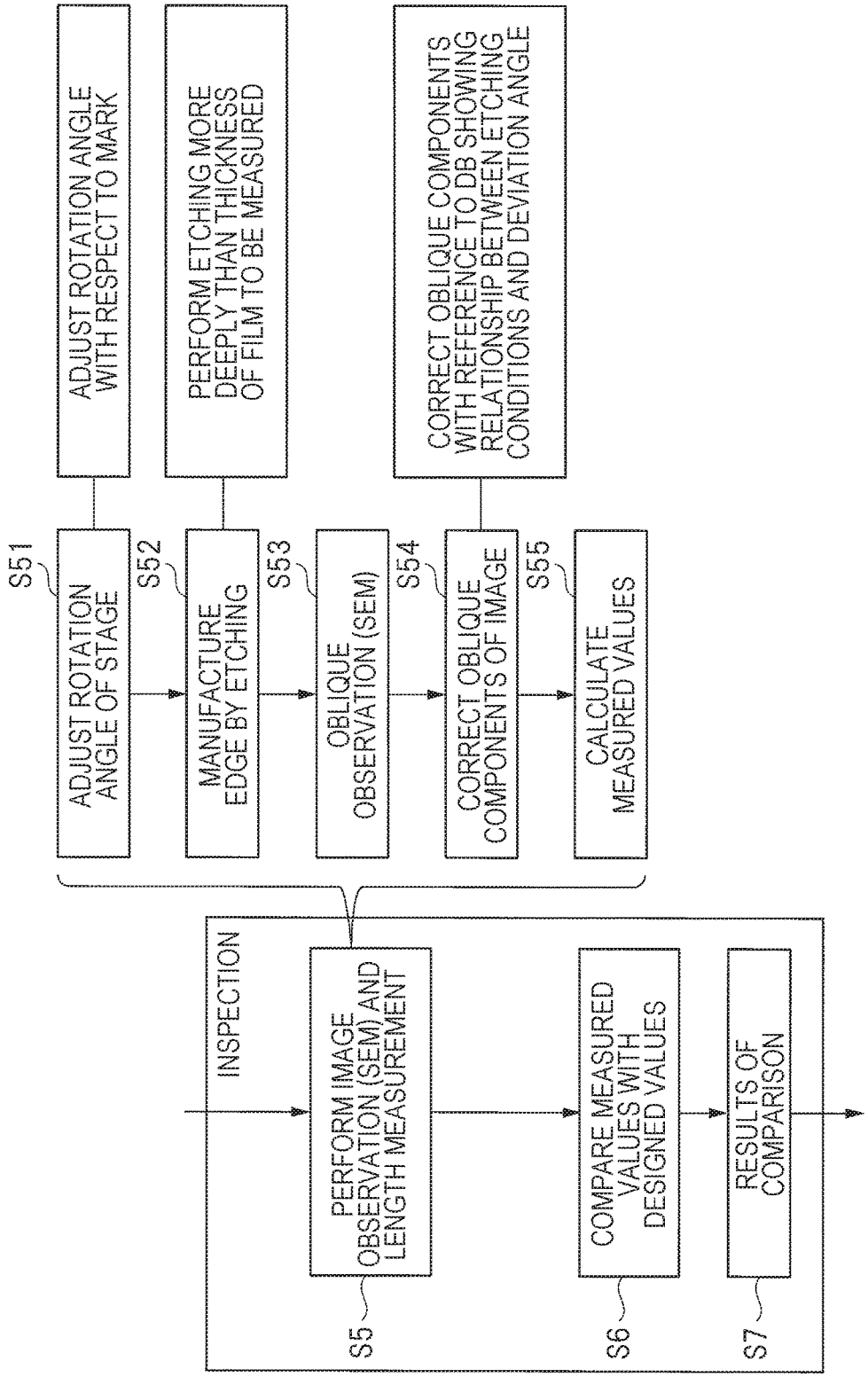
FIG. 3 is a flowchart illustrating in detail an inspection process shown in FIG. 2.

The inspection process shown in FIG. 2 will be described in detail using FIG. 3 with reference to FIGS. 4 to 8. FIG. 3 is a flowchart illustrating in detail the inspection process shown in FIG. 2.

Here, in a device manufacturing method in which the thickness of a target object, or the depth of etching, formed on the substrate 30 is measured, a case where the thickness of the target object formed on the substrate 30 is measured will be described. However, the device manufacturing method according to the present embodiment can also be applied to a case where the depth of etching is measured.

Figure 4A:
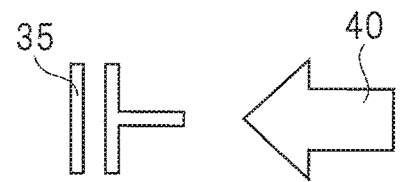
FIGS. 4A to 4C are explanatory drawings each illustrating an example of rotation angle adjustment of a stage shown in FIG. 3.
Figure 4B:
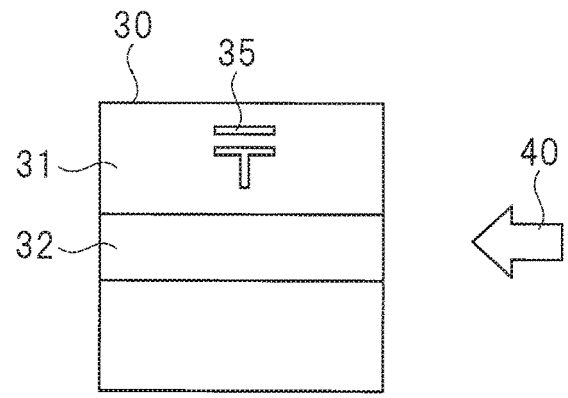
Figure 4C:
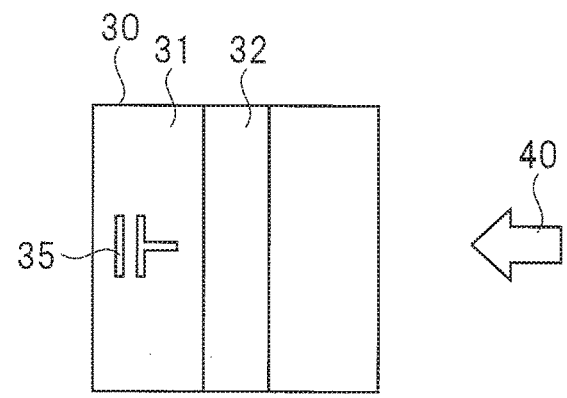

In step S5 of performing the image observation and length measurement in the above-described inspection process, as specifically shown in FIG. 3, first of all, the control unit 20 adjusts a rotation angle of the stage 12 on which the substrate 30 is placed (step S51). This step S51 will be described with reference to FIGS. 4A to 4C. FIGS. 4A to 4C are explanatory drawings each illustrating an example of the rotation angle adjustment of the stage shown in FIG. 3.

In step S51, a rotation angle of the stage 12 is adjusted with respect to the mark 35 on the substrate 30 as shown in FIGS. 4A to 4C. When the rotation angle of the stage 12 is adjusted, information about the mark 35 on the substrate 30 is used, the information being included in the processing recipe. This mark 35 is information about the adjustment of the rotation angle of the stage 12 on which the substrate 30 is placed.

Figure 5A:
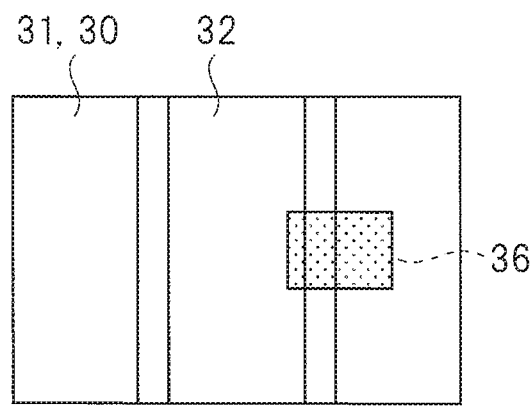
FIGS. 5A and 5B are explanatory drawings each illustrating an example of etching at the time of edge manufacturing shown in FIG. 3.
Figure 5B:
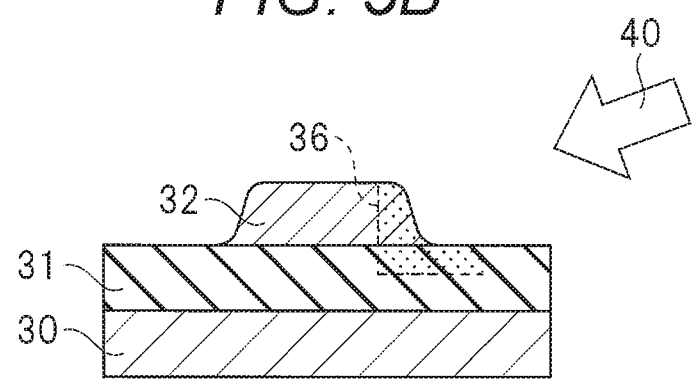

FIG. 4A shows a positional relationship in which an observation direction 40 of the SEM and the mark 35 on the substrate 30 correctly face each other; FIG. 4B shows a state before the rotation angle of the stage 12 is adjusted with respect to the mark 35 on the substrate 30; and FIG. 4C shows a state after the rotation angle of the stage 12 is adjusted. A first layer film 31 and a second layer film 32 are laminated on the substrate 30 as described below (FIGS. 5A and 5B).

As shown in FIG. 4A, a mark that enables to know the rotation angle of the stage 12, on which the substrate 30 is placed, with respect to the observation direction 40 of the SEM is used as the mark 35 on the substrate 30. For example, the mark 35 that is similar to a postal mark as shown in FIG. 4A is used, but an applicable mark is not limited to this mark. FIG. 4A shows a positional relationship in which the mark 35 on the substrate 30 correctly faces the observation direction 40 of the SEM. In other words, the positional relationship in which the mark 35 on the substrate 30 correctly faces the observation direction 40 of the SEM means a state in which when viewing from the observation direction 40 of the SEM, the mark 35 is directed in the correct direction.

As shown in FIG. 4B, in the state before the rotation angle of the stage 12 is adjusted with respect to the mark 35 on the substrate 30, the mark 35 on the substrate 30 is not located at a position at which the mark 35 correctly faces the observation direction 40 of the SEM. In other words, when viewing from the observation direction 40 of the SEM, the mark 35 is laterally directed. In the case of such a state, the rotation angle of the stage 12 is adjusted in such a manner that the mark 35 on the substrate 30 is positioned to correctly face the observation direction 40 of the SEM. Here, in FIG. 4B, the mark 35 is rotated counterclockwise by 90°.

After the adjustment of the stage 12, as shown in FIG. 4C, the mark 35 on the substrate 30 is positioned to correctly face the observation direction 40 of the SEM. In other words, when viewing from the observation direction 40 of the SEM, the mark 35 is correctly directed.

In such a manner, in step S51, the rotation angle of the stage 12 on which the substrate 30 is placed is adjusted in such a manner that the mark 35 on the substrate 30 is positioned to correctly face the observation direction 40 of the SEM.

Figure 6A:
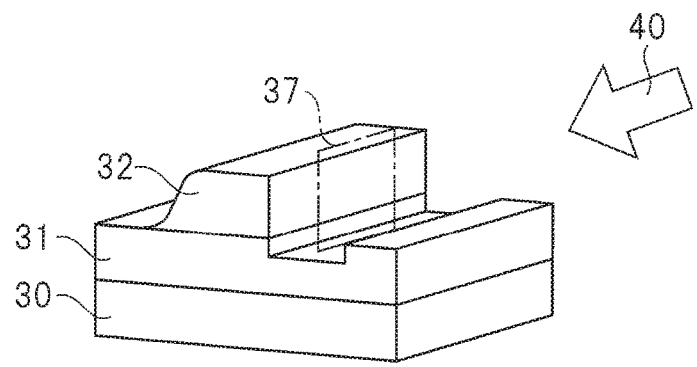
FIGS. 6A to 6C are explanatory drawings each illustrating an example of obtaining an SEM image after the edge manufacturing shown in FIG. 3.
Figure 6B:
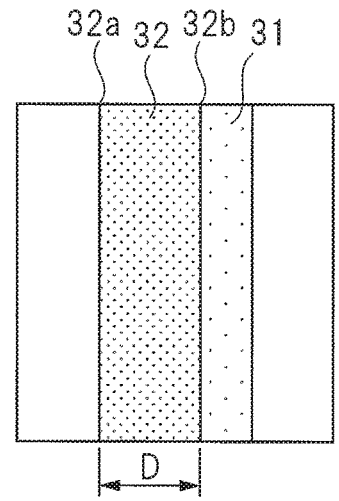

Next, as shown in FIG. 3, an edge is manufactured by etching in the FIB-SEM unit 10, the edge being used when the cross section of the etching is observed (step S52). Subsequently, after the edge is manufactured, the cross section of the etching is observed from a direction having a predetermined angle (step S53). These steps S52 and S53 will be described with reference to FIGS. 5 and 6. FIGS. 5A and 5B are explanatory drawings each illustrating an example of etching at the time of edge manufacturing shown in FIG. 3. FIGS. 6A to 6C are explanatory drawings each illustrating an example of obtaining an SEM image after the edge manufacturing shown in FIG. 3.

Figure 6C:
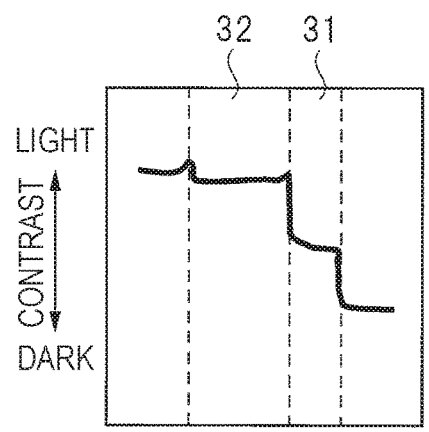

In step S52, as shown in FIGS. 5 and 6, at the time of etching for manufacturing an edge, the etching is performed more deeply than the thickness of a film to be measured. FIG. 5A is a top view of a device; and FIG. 5B is a cross-sectional view of the device. FIG. 6A is a perspective view (hatching is omitted) of the device after the etching; FIG. 6B shows an SEM image; and FIG. 6C shows the contrast of the SEM image.

The following case, but not limited to this case, is considered where, as shown in FIGS. 5A and 5B, there is formed a MEMS structure having, for example, a structure in which a first layer film 31 made of silicon dioxide $SiO_2$ and a second layer film 32 made of tungsten W are laminated on the substrate 30 made of silicon Si.

In a state before the edge is manufactured, as shown in FIG. 5B, an end part of the second layer film 32 made of tungsten W is arc-shaped, and therefore the end part cannot be correctly detected when the SEM image is obtained. Accordingly, a region 36 indicated with broken lines in FIGS. 5A and 5B is etched to manufacture an edge, and an SEM image is then obtained. When the etching is performed to manufacture the edge, the etching is performed more deeply than the film thickness of the second layer film 32 made of tungsten W, which is a film to be subjected to length measurement, up to a position at which the first layer film 31 made of silicon dioxide $SiO_2$ is slightly scraped. The etching results in a structure as shown in FIG. 6A. FIG. 6A is a perspective view illustrating only a part subjected to the etching.

In step S53, after the etching is performed to manufacture the edge, a cross section of the etching is observed. In the case of this observation, the electron beam 14a is emitted from an oblique direction (the observation direction 40 of the SEM) having a predetermined angle with respect to the plane of the substrate 30, and is then detected by the charged particle detector 16, thereby obtaining an SEM image. FIG. 6B illustrates an SEM image of a region 37 indicated with dash-dot lines in FIG. 6A, and shows that an image of a cross section etched more deeply than the film thickness of the second layer film 32 made of tungsten W has been obtained.

Figure 8:
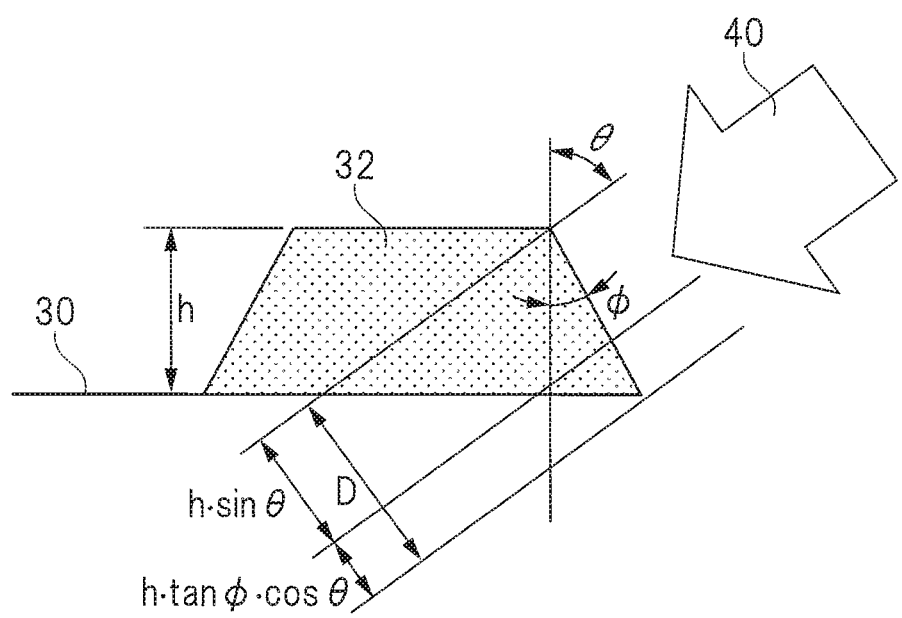
FIG. 8 is an explanatory drawing illustrating an example of correction of an SEM image based on the deviation angle shown in FIG. 3.

In the SEM image obtained after the edge is manufactured, as shown in FIG. 6B, an edge 32a of the second layer film 32 made of tungsten W is correctly detected, and an interface 32b at the boundary between the second layer film 32 made of tungsten W and the first layer film 31 made of silicon dioxide $SiO_2$ is also detected, and therefore a width D of the SEM image corresponding to the thickness (h) of the second layer film 32 made of tungsten W is determined. The relationship between the thickness (h) of the second layer film 32 made of tungsten W and the width D of the SEM image will be described later (FIG. 8).

As shown in FIG. 6C, a difference in material causes a difference in contrast in the SEM image. Therefore, detecting the difference in contrast enables to distinguish between the second layer film 32 made of tungsten W and the first layer film 31 made of silicon dioxide $SiO_2$. A difference in material between layers exerts an influence upon the electron density, which causes the contrast of the SEM image to change. The contrast is a degree that represents the light and dark of a color. Between tungsten W of the second layer film 32 and silicon dioxide $SiO_2$ of the first layer film 31, the contrast of tungsten W is lighter, and the contrast of silicon dioxide $SiO_2$ is darker. The contrast can also be expressed as lightness. Dark corresponds to high lightness, and light corresponds to low lightness. When a determination is made by the difference in contrast as to whether or not there is a difference in material, information about the order of the light and dark as the contrast is used, the information being contained in a processing recipe.

In such a manner, in step S52, as shown in FIGS. 5 and 6, the edge used when the cross section of the etching is observed is manufactured. Subsequently, in step S53, after the edge is manufactured, a cross section of the etching is observed from a direction having a predetermined angle by using the SEM image.

Next, as shown in FIG. 3, the length-measuring processing part 21a of the calculation processing unit 21 corrects, on the basis of an etching angle (deviation angle), the SEM image obtained by observing the cross section of the etching (step S54). Subsequently, the thickness of the target object is calculated to obtain a measured value (step S55). These steps S54 and S55 will be described with reference to FIGS. 7 and 8. FIG. 7 is an explanatory chart illustrating an example of a database of the relationship between etching conditions and the deviation angle shown in FIG. 3. FIG. 8 is an explanatory drawing illustrating an example of correction of an SEM image based on the deviation angle shown in FIG. 3.

In step S54, as shown in FIGS. 7 and 8, oblique components of the SEM image are corrected on the basis of the deviation angle with reference to the database (DB) 21b of the relationship between etching conditions and the deviation angle. In addition, in step S54, the thickness of the second layer film 32 made of tungsten W, which is a film to be subjected to length measurement, is calculated to obtain a measured value.

FIG. 7 shows the database 21b of the relationship between etching conditions and the deviation angle. The etching conditions include a material, a current and a voltage. In an example shown in FIG. 7, in the case of etching condition "1", when the material is tungsten W, the current is 80 pA and the voltage is 30 kV, the deviation angle (φ) is 3 deg.

FIG. 8 shows the correction of an SEM image based on a deviation angle, where θ is an observation angle of the SEM, φ is a deviation angle made by an oblique surface of the second layer film 32 made of tungsten W and the direction perpendicular to the plane of the substrate, D is the width of the SEM image, and h is the thickness of the second layer film 32 made of tungsten W.

The width D of the SEM image is calculated as follows:

$$D = h \cdot \sin\theta + h \cdot \tan\varphi \cdot \cos\theta \quad \text{Formula (1)}$$

For example, when φ=0, D=h·sin θ.

From the formula (1), the thickness h of the second layer film 32 made of tungsten W is calculated as follows:

$$h = D/(\sin\theta + \tan\varphi \cdot \cos\theta) \quad \text{Formula (2)}$$

If the width D of the SEM image, the observation angle θ of the SEM and the deviation angle φ are obtained, the thickness h of the second layer film 32 made of tungsten W can be calculated by using the formula (2). The thickness h of the second layer film 32 made of tungsten W corresponds to the measured value of the thickness of the target object.

In such a manner, in step S54, the SEM image obtained by observing the cross section of the etching is corrected on the basis of the deviation angle. Subsequently, in step S55, the thickness of the target object is calculated to obtain a measured value. As the result, the thickness of the target object can be correctly measured.

In the above explanation, the case where the thickness of the target object formed on the substrate 30 is measured is described. However, the present embodiment can also be applied to a case where the depth of etching is measured. In this case as well, as with the case where the thickness of the target object is measured, the depth of etching can be correctly measured by correcting, on the basis of the etching angle (deviation angle), the SEM image obtained by observing the cross section of the etching, and then by calculating the depth of the etching to obtain a measured value.

Effects

According to the device manufacturing method and the device manufacturing apparatus in the embodiments described above, when an SEM image is observed from an observation direction 40 by using an electron beam 14a, correct length measurement can be performed. More specifically, during manufacturing of a device of a MEMS structure, the thickness of a target object, or the depth of etching, can be correctly measured.

The invention made by the present inventors has been specifically described on the basis of the embodiments as above. However, the present invention is not limited to the above-described embodiments, and it is needless to say that the present invention can be modified in various ways within the scope that does not deviate from the gist of the invention.

For example, in the above-described embodiments, the device of the MEMS structure has been described as an example of a device. However, the present invention can also be applied to other devices. In addition, the MEMS structure is not limited to the structure in which the first layer film 31 made of silicon dioxide SiO$_2$ and the second layer film 32 made of tungsten W are laminated on the substrate 30 made of silicon Si, either.

Incidentally, the present invention is not limited to the above-described embodiments, and includes various modified examples. For example, the above-described embodiments have been described in detail so as to clearly illustrate the present invention. Therefore, the present invention is not always limited to the invention having all of the disclosed configurations.

Moreover, for some configurations of the embodiments, it is possible to make the addition, deletion, and substitution of other configurations.

What is claimed is:

1. A device manufacturing method comprising
a length measuring step of, on the basis of an observation target image of a Scanning Electron Microscope (SEM) image taken from a direction having a predetermined angle from a direction perpendicular to a plane of a substrate, measuring a thickness of a target object, or a depth of etching, formed on the substrate,
wherein in the length measuring step, an etching angle made by a cross section of the etching and the direction perpendicular to the plane of the substrate is calculated from processing data of the target object, and the thickness of the target object or the depth of the etching is measured on the basis of the calculated etching angle, and
wherein information about a processing recipe used when the target object is formed on the substrate includes information about order of light and dark as a contrast used when the cross section of the etching is observed.

2. The device manufacturing method according to claim 1, wherein in the length measuring step, the thickness of the target object or the depth of the etching is measured on the basis of a database in which conditions of an ion beam of the etching are associated with the etching angle made by the cross section of the etching and the direction perpendicular to the plane of the substrate.

3. The device manufacturing method according to claim 1, wherein information about a processing recipe used when the target object is formed on the substrate includes information about adjustment of a rotation of a stage on which the substrate is placed.

4. The device manufacturing method according to claim 1, wherein when the cross section of the etching is observed, a cross section that has been etched more deeply than the film thickness of the target object to be subjected to length measurement is observed.

5. The device manufacturing method according to claim 1, wherein
the length measuring step comprises:
adjusting a rotation angle of a stage on which the substrate is placed;
manufacturing an edge used when the cross section of the etching is observed;
after the edge is manufactured, observing the cross section of the etching from the direction having the predetermined angle; and
correcting, on the basis of the etching angle, the SEM image obtained by observing the cross section of the etching, and calculating the thickness of the target object or the depth of the etching.

6. The device manufacturing method according to claim 1, wherein the target object is a MEMS structure.

7. A device manufacturing apparatus comprising:
a Focused Ion Beam (FIB)-Scanning Electron Microscope (SEM) unit that is a combined unit of an FIB unit and an SEM unit; and
a control unit that controls processing and observation in the FIB-SEM unit, wherein
the control unit comprises a length-measuring processing part for, on the basis of an observation target image of an SEM image taken from a direction having a predetermined angle from a direction perpendicular to a plane of a substrate, measuring a thickness of a target object, or a depth of etching, formed on the substrate,
the length-measuring processing part calculates, from processing data of the target object, an etching angle made by a cross section of the etching and the direction perpendicular to the plane of the substrate, and measures the thickness of the target object or the depth of the etching on the basis of the calculated etching angle, and
information about a processing recipe used when the target object is formed on the substrate includes information about order of light and dark as a contrast used when the cross section of the etching is observed.

8. The device manufacturing apparatus according to claim 7, wherein
the length-measuring processing part calculates the thickness of the target object or the depth of the etching on the basis of a database in which conditions of an ion beam of the etching are associated with the etching angle made by the cross section of the etching and the direction perpendicular to the plane of the substrate.

9. The device manufacturing apparatus according to claim 7, wherein information about a processing recipe used when the target object is formed on the substrate includes information about adjustment of a rotation of a stage on which the substrate is placed.

10. The device manufacturing apparatus according to claim 7, wherein when the cross section of the etching is observed, a cross section that has been etched more deeply than the film thickness of the target object to be subjected to length measurement is observed.

11. The device manufacturing apparatus according to claim 7, wherein on the basis of the control by the control unit,
the FIB-SEM unit adjusts a rotation angle of a stage on which the substrate is placed, manufactures an edge used when the cross section of the etching is observed, and after the edge is manufactured, observes the cross section of the etching from the direction having the predetermined angle, and
the length-measuring processing part corrects, on the basis of the etching angle, the SEM image obtained by observing the cross section of the etching, and calculates the thickness of the target object or the depth of the etching.

12. The device manufacturing apparatus according to claim 7, wherein the target object is a MEMS structure.

* * * * *